United States Patent
Yoshii et al.

(10) Patent No.: US 7,738,280 B2
(45) Date of Patent: Jun. 15, 2010

(54) RESISTIVE NONVOLATILE MEMORY ELEMENT, AND PRODUCTION METHOD OF THE SAME

(75) Inventors: Shigeo Yoshii, Osaka (JP); Ichiro Yamashita, Nara (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 12/552,735

(22) Filed: Sep. 2, 2009

(65) Prior Publication Data
US 2010/0008128 A1    Jan. 14, 2010

Related U.S. Application Data

(63) Continuation of application No. PCT/JP2008/003508, filed on Nov. 28, 2008.

(30) Foreign Application Priority Data
Feb. 19, 2008    (JP) .............................. 2008-036810

(51) Int. Cl.
  H01L 27/10    (2006.01)
  G11C 13/00    (2006.01)
  H01L 45/00    (2006.01)
  H01L 49/00    (2006.01)

(52) U.S. Cl. ........................... 365/148; 257/37; 257/43; 257/E21.006; 257/E29.325; 365/100; 438/385; 977/773; 977/810; 977/943

(58) Field of Classification Search ................. 257/37, 257/43, E21.006, E29.325; 365/46, 100, 365/148; 438/384, 385; 977/773, 810, 943
See application file for complete search history.

(56) References Cited
U.S. PATENT DOCUMENTS
2004/0183647 A1    9/2004    Arai et al.

2005/0167699 A1    8/2005    Sugita et al.
2006/0154432 A1    7/2006    Arai et al.

(Continued)

FOREIGN PATENT DOCUMENTS
JP    2004-111734    4/2004

(Continued)

OTHER PUBLICATIONS

Y. Ogimoto., et al., "Resistance switching memory device with a nanoscale confined current path", Applied Physics Letters, 2007, vol. 90, American Institute Physics.

*Primary Examiner*—Richard Elms
*Assistant Examiner*—Michael Lulis
(74) *Attorney, Agent, or Firm*—McDermott Will & Emery LLP

(57) ABSTRACT

An object of the present invention is to provide a resistive nonvolatile memory element having an electric current path which can be realized by a simple and convenient process, and capable of allowing for micro-fabrication.

The resistive nonvolatile memory element of the present invention includes first electrode 203, oxide semiconductor layer 204a which is formed on the first electrode 203 and the resistance of which is altered depending on the applied voltage, metal nanoparticles 204b having a diameter of between 2 nm and 10 nm arranged on the oxide semiconductor layer 204a, tunnel barrier layer 204c formed on the oxide semiconductor layer 204a and on the metal nanoparticles 204b, and second electrode 206 formed on the tunnel barrier layer 204c, in which the metal nanoparticles 204b are in contact with the oxide semiconductor layer 204a.

10 Claims, 14 Drawing Sheets

U.S. PATENT DOCUMENTS

| | | |
|---|---|---|
| 2006/0160304 A1 | 7/2006 | Hsu et al. |
| 2006/0231889 A1* | 10/2006 | Chen et al. .................. 257/325 |
| 2007/0090444 A1 | 4/2007 | Park et al. |
| 2007/0167008 A1 | 7/2007 | Hsu et al. |

FOREIGN PATENT DOCUMENTS

| | | |
|---|---|---|
| JP | 2004-281497 | 10/2004 |
| JP | 2006-196601 | 7/2006 |
| JP | 2006-203178 | 8/2006 |
| JP | 2006-210639 | 8/2006 |
| JP | 2006-269905 | 10/2006 |
| JP | 2007-116166 | 5/2007 |
| JP | 2007-180174 | 7/2007 |
| JP | 2007-180473 | 7/2007 |
| JP | 2007-288008 | 11/2007 |
| JP | 2008-021750 | 1/2008 |
| WO | WO 2004/027877 A1 | 4/2004 |
| WO | WO 2005/041303 A1 | 5/2005 |
| WO | WO 2006/104150 A1 | 3/2006 |

* cited by examiner

US 7,738,280 B2

RESISTIVE NONVOLATILE MEMORY ELEMENT, AND PRODUCTION METHOD OF THE SAME

RELATED APPLICATIONS

This is a Continuation Application of the International Application No. PCT/JP2008/003508, filed on Nov. 28, 2008. This Non-provisional application claims priority under 35 U.S.C. 119(a) on Patent Application No. 2008-036810 filed in Japan on Feb. 19, 2008, the entire contents of which are hereby incorporated by reference.

BACKGROUND OF THE INVENTION

1. Field of the Invention

The present invention relates to a resistive nonvolatile memory element in which nanoparticles are used, and a method for producing the element in which a protein-inorganic nanoparticle complex is used.

2. Related Art

Although resistive memory elements are expected as one of novel nonvolatile memory elements, problems of needs for forming process (process of applying a high voltage after producing the element to initialize the characteristics of the element), and a large variation of characteristics among the elements are often caused. The forming process is considered as a process for forming a local electric current path inside the element, and the differences of the states of the produced electric current paths are believed to be responsible for such variation of characteristics. In addition, reduction of the electric current value required for the memory operation would be preferable since electric power consumption in connection with the memory driving can be reduced. When the electric current density of the element can be reduced, the electric current value to be required can be decreased even with elements having an identical size. The term "electric current density of element" herein means the electric current density of the element, as a whole, i.e., a value derived by dividing the electric current value required for the element operation by the area of the entire element, unless otherwise described in particular.

In order to solve the problems of needs for the forming process and variation of characteristics, techniques of constricting an electric current by forming a local electric current path inside the element beforehand, or arranging fine structures that will lead to triggering of the electric current path formation have been already reported so far. Since constricting of the electric current path reduces the electric current density of the element, it also results in an effect of reducing the electric power consumption.

Patent Document 1 discloses a structure provided with a recessed part or a protruding part on the interface between a resistive layer and an electrode. In addition, a structure including metal fine particles arranged on the top of the protruding part (FIG. 2) has been disclosed. According to Patent Document 1, the voltage of the electrical pulse required for resistance alteration can be reduced, and variation of the electrical pulse width can be suppressed.

Patent Document 2 discloses a structure provided with a resistive layer between a first electrode having a nanochip (ultrafine projection) and a second electrode. Furthermore, a structure provided with a material of different type between a nanochip and a resistive layer (FIG. 3) has been disclosed. According to Patent Document 2, bipolar switching performance can be improved, whereby weak electrical pulse can be used with a low voltage.

Patent Document 3 discloses a structure having a resistive layer between two electrodes, with one electrode being provided with a protruding electrode material. According to Patent Document 3, electric power consumption in writing/erasing can be reduced, and thus a memory element can be formed with favorable reproducibility which achieves stable switching operation without occurrence of failure in writing due to low resistance.

In Nonpatent Document 1, a structure including on a bottom electrode, an insulating layer having micropores in part (mazelike nanogap insulator), and a resistive layer and an upper electrode arranged thereon has been disclosed. According to Nonpatent Document 1, high speed writing/erasing is enabled without need of the forming process.

Unlike control of the electric current path described above, a technique of increasing the rate of resistance change and also suppressing the variation thereof by increasing the region of the crystal interface of the resistance-altering material, thereby making the crystal size uniform has also been already reported.

Patent Document 4 discloses a structure in which a resistive layer and a laminating film having an electric resistivity different from that of the resistive layer are alternately laminated. Furthermore, a structure in which crystals of the resistive layer are arranged which were grown from the metal particles on the electrode as crystal cores (FIG. 4) has been disclosed. Also, a structure in which metal particles (island growth cores) are arranged via a surface tension-adjusting film having a tunnel effect on an electrode (FIG. 5) has been disclosed. According to Patent Document 4, the ratio of electric resistivity in the high resistance state and the low resistance state (CER value) can be increased by providing a large number of junction interfaces, and also variation of the CER value can be depressed by making the crystal size uniform.

In addition, a technique of use of a resistance-altering material in combination with arrangement of fine particles utilizing a protein has also been reported.

Patent Document 5 discloses a structure formed by arranging fine particles on a columnar electric conductor embedded in a dielectric material utilizing ferritin. According to Patent Document 5, reliability with respect to insulation between top and bottom electrodes can be enhanced. In Patent Documents 8 and 9, nonvolatile resistive memory elements having a layer structure of: bottom electrode/resistive layer/tunnel barrier layer/upper electrode have been disclosed.

Patent Document 1: pamphlet of International Publication No. 2005/041303 (particularly, FIG. 6)

Patent Document 2: Japanese Unexamined Patent Application, First Publication No. 2006-203178

Patent Document 3: Japanese Unexamined Patent Application, First Publication No. 2007-180473

Patent Document 4: Japanese Unexamined Patent Application, First Publication No. 2007-180174 (particularly, paragraph number 0065)

Patent Document 5: Japanese Unexamined Patent Application, First Publication No. 2006-210639

Patent Document 6: Japanese Unexamined Patent Application, First Publication No. 2006-196601

Patent Document 7: Japanese Unexamined Patent Application, First Publication No. 2004-111734

Patent Document 8: Japanese Unexamined Patent Application, First Publication No. 2007-288008

Patent Document 9: Japanese Unexamined Patent Application, First Publication No. 2008-021750

Nonpatent Document 1: Ogimoto et al., Appl. Phys. Lett. 90 (2007) 143515

SUMMARY OF THE INVENTION

In order to obtain a high-capacity nonvolatile memory, it is necessary to arrange a large number of micro-fabricated homogenous nonvolatile resistive memory elements, in the state of a matrix.

Although Patent Documents 1-3 and Nonpatent Document 1 disclose techniques for constricting an electric current path, the following special and highly accurate process techniques have been required for obtaining homogenous and microstructures by these techniques. Patent Document 1 necessitates a technique for providing a recessed part or a protruding part on the interface with high accuracy; Patent Document 2 necessitates a nanochip forming technique; Patent Document 3 necessitates a technique for forming a protruding electrode material; and Nonpatent Document 1 necessitates a technique for forming an insulating layer having micropores in part. When the accuracy of these process techniques is insufficient, production of the micro-fabricated element would be difficult. In addition, low reproducibility in producing the nanostructure leads to increase in variation among each element. For example, the electric current path reported in Nonpatent Document 1 has a size of approximately 50 to 100 nm, and exhibits an irregular shape; therefore, it is not applicable to microelements with a size of less than 100 nm.

Meanwhile, Patent Document 1 shows a structure illustrated in FIG. 2. Paragraph number 0036 in Patent Document 1 describes that protruding parts 66 are provided on the surface of information memory layer 62 formed on substrate 60 and bottom electrode 61, and fine particles 64 are embedded into upper electrode 63 on the protruding part 66 of the information memory layer 62. Although the information memory layer 62 has neither a recessed part nor a protruding part on its inferior face 68, the upper face 69 has the protruding part 66. In such illustration, protruding part 63b is formed on the surface of the upper electrode 63 above the fine particles 64.

FIG. 2 shows the fine particles 64 employed as an etching mask. However, the fine particles 64 are embedded in the upper electrode 63, and Patent Document 1 suggests in paragraph number 0037 that when the fine particle 64 is constituted with an electrically conductive material such as a metal, the fine particles 64 have a function as a part of the electrode 63. Furthermore, the presence of a tunnel barrier layer around the fine particles 64, which is a constitutional element of the present invention, is not shown. Therefore, the configuration shown in FIG. 2 cannot achieve the effects of the electric current constriction as disclosed herein.

Additionally, Patent Document 2 discloses a structure illustrated in FIG. 3. According to Patent Document 2, first electrode 102 is provided with nanochips 104, and memory cell materials 106 are present among the nanochips 104. Also, Patent Document 2 describes in paragraph 0029 that material 500 is a memory resistive element material distinct from the memory cell material 106, or a dielectric material not having memory resistance characteristics. In one aspect, material 500 is crystallized Ir.

It is clear that the material 500 is distinct from the tunnel barrier layer in the present invention. However, even if it is assumed that the material 500 may be a tunnel barrier layer, it is structurally different from the present invention since the material 500 is arranged between the memory cell material 106 and the nanochip 104. Therefore, the configuration shown in FIG. 3 cannot achieve the effect exhibited by the electric current constriction as disclosed herein.

Patent Document 4 does not suggest any constricting technique of an electric current path. Moreover, a technique for growing the crystal of the resistive layer from the metal particles (island growth cores) is also required according to Patent Document 4, as a highly accurate process technique.

Structures illustrated in FIG. 4 and FIG. 5 are shown in the drawings that depict the process steps according to Patent Document 4. In FIG. 4 and FIG. 5, electrode film 12a is arranged on semiconductor substrate 11, and metal island crystal cores 14, seeds 15 grown from the material that constitutes the resistive memory film, resistive memory film 13 and electrode film 12b are arranged. In addition to them, surface tension-adjusting film 16a which enables the electric current to flow by a tunnel effect, and electrode film 12c are shown in FIG. 5.

However, paragraph 0072 in Patent Document 4 describes that the island growth core 14 and the seed 15 become the identical crystal as a part of resistive memory film 13 after the formation by a vacuum film deposition method, although the island growth core 14 and the seed 15 are explicitly depicted separately in the figure for explanatory purpose. Furthermore, unlike the island crystal cores 14 being arranged on the electrode film 12a or the surface tension-adjusting film 16a in FIG. 4 and FIG. 5, metal nanoparticles are arranged on an oxide semiconductor layer in the configuration according to the present invention. Therefore, the configuration shown in FIG. 4 and FIG. 5 cannot achieve the effect of the electric current constriction as described according to the present invention.

Patent Document 5 does not disclose the constricting technique of an electric current path. Also in Patent Document 5, a technique for forming a columnar electric conductor is required as a highly accurate process technique. With respect to Patent Documents 6 and 7, description is made later.

The present invention solves the foregoing problems, and an object of the invention is to provide a resistive nonvolatile memory element having an electric current path which can be effected by a simple and convenient process and being capable of allowing for micro-fabrication, and to provide a method for producing the same.

The resistive nonvolatile memory element according to the present invention which solves the problems described above includes: a first electrode; an oxide semiconductor layer which is formed on the first electrode and the resistance of which is altered depending on the applied voltage; metal nanoparticles having a diameter of between 2 nm and 10 nm and being arranged on the oxide semiconductor layer; a tunnel barrier layer formed on the oxide semiconductor layer and the metal nanoparticles; and a second electrode formed on the tunnel barrier layer, in which the metal nanoparticles are in contact with the oxide semiconductor layer.

The tunnel barrier layer is constituted with a silicon oxide film has a film thickness of preferably between 1 nm and 5 nm.

The oxide semiconductor layer is preferably constituted with a titanium oxide film.

The method for producing a resistive nonvolatile memory element according to the present invention for solving the aforementioned problems includes the steps of: forming a first electrode on a substrate; forming an oxide semiconductor layer the resistance of which is altered depending on the applied voltage, on the first electrode; arranging ferritin including a metal compound core on the oxide semiconductor layer; modifying the metal compound core into a metal nanoparticle by removing the protein of the ferritin; forming a tunnel barrier layer on the oxide semiconductor layer and on the metal nanoparticles; and forming a second electrode on the tunnel barrier layer.

It is preferred that the tunnel barrier layer be constituted with a silicon oxide film, and has a film thickness of between 1 nm and 5 nm.

The oxide semiconductor layer is preferably constituted with a titanium oxide film.

In the method of driving a resistive nonvolatile memory element according to the present invention for solving the above problems the resistive nonvolatile memory element includes: a first electrode; an oxide semiconductor layer which is formed on the first electrode and the resistance of which is altered depending on the applied voltage; metal nanoparticles having a diameter of between 2 nm and 10 nm and being arranged on the oxide semiconductor layer; a tunnel barrier layer formed on the oxide semiconductor layer and the metal nanoparticles; and a second electrode formed on the tunnel barrier layer, the metal nanoparticles being in contact with the oxide semiconductor layer, and the driving method includes: a first writing step wherein the resistance state of the oxide semiconductor layer is changed from a low resistance state into a high resistance state by applying a writing voltage so as to make the potential of the first electrode negative with respect to the second electrode; a second writing step wherein the resistance state of the oxide semiconductor layer is changed from a high resistance state into a low resistance state by applying a writing voltage so as to make the potential of the first electrode positive with respect to the second electrode; and a reading step wherein the resistance state of the oxide semiconductor layer is specified by applying between the first electrode and the second electrode a reading voltage or a reading electric current capable of reading the resistance state without changing the resistance state of the oxide semiconductor layer.

The tunnel barrier layer is constituted with a silicon oxide film has a film thickness of preferably between 1 nm and 5 nm.

The oxide semiconductor layer is preferably constituted with a titanium oxide film.

The absolute value of the writing voltage to give a negative potential of the first electrode with respect to the second electrode, and the absolute value of the writing voltage to give a positive potential of the first electrode with respect to the second electrode are both preferably less than 1.3 V.

The objects described in the foregoing, other objects, features and advantages of the present invention will be apparent from the following detailed description of preferred embodiments with reference to attached drawings.

According to the resistive nonvolatile memory element of the present invention, a resistive nonvolatile memory element is enabled having an electric current path which can be effected by a simple and convenient process, and capable of allowing for micro-fabrication, and to provide a method for producing the same.

DETAILED DESCRIPTION OF THE INVENTION

As the substrate, a silicon substrate can be used.

Ferritin is a spherical protein, and includes a metal compound inside thereof. When any metal compound is not included therein but has a hollow space inside, ferritin is referred to as "apoferritin". Apoferritin is constituted with 24 protein subunits. As apoferritin in the present invention, apoferritin derived from horse may be used.

Embodiments

The method for production of a resistive nonvolatile memory element of the present invention is first explained.

Figure 6:
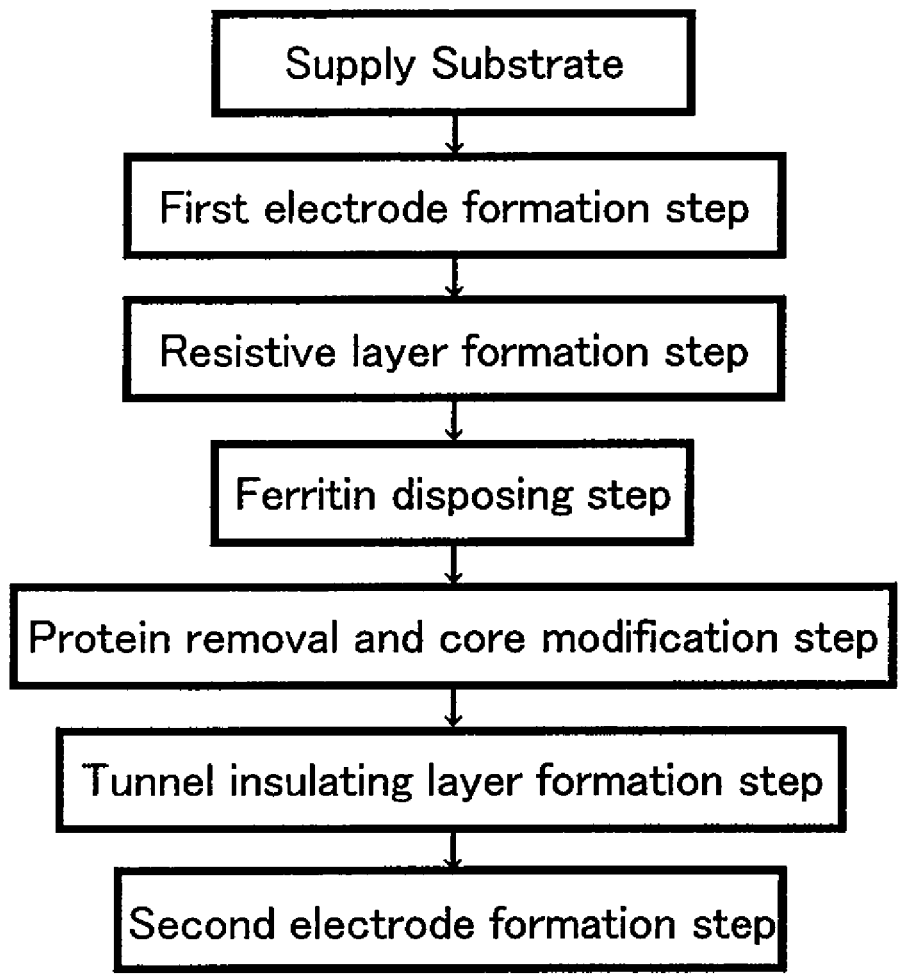
FIG. 6 shows a view illustrating a process flow of a resistive nonvolatile memory element according to Embodiment 2.
Figure 7:
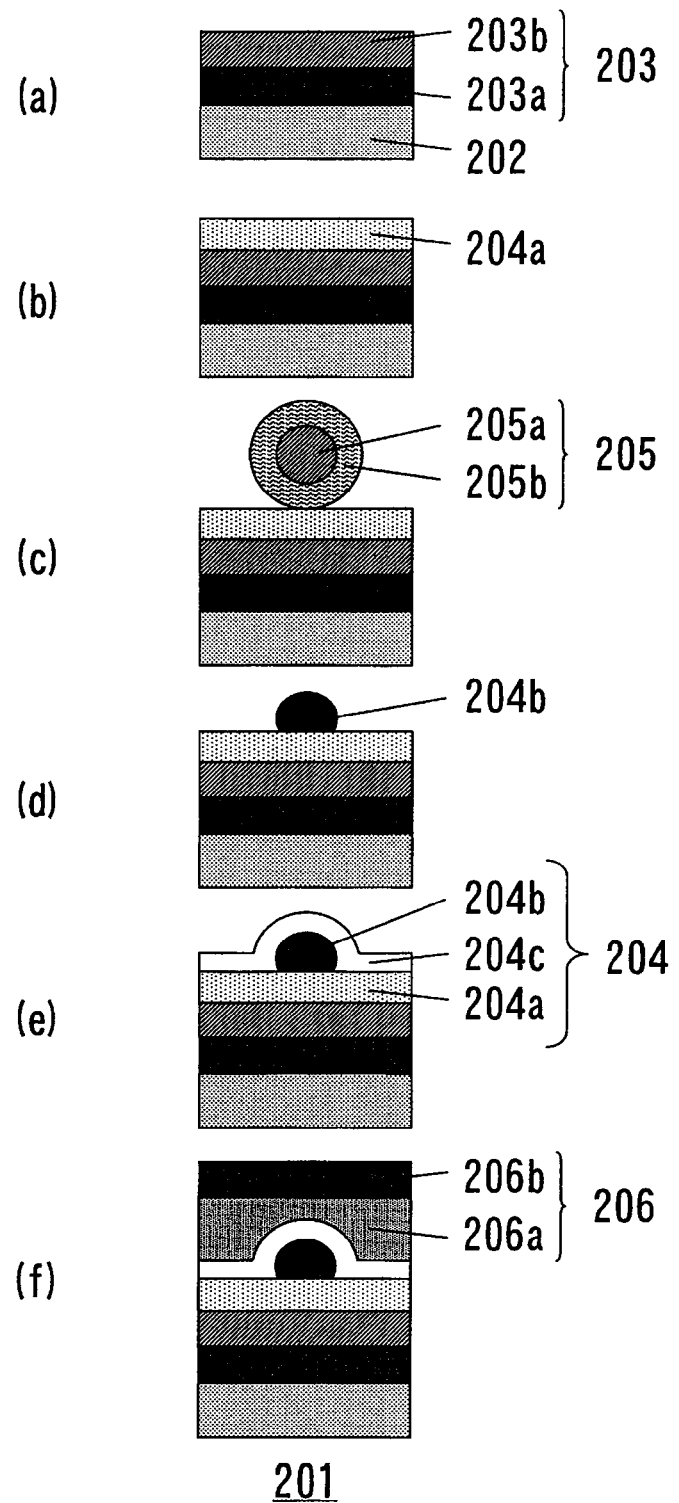
FIG. 7 shows a view illustrating steps for producing a resistive nonvolatile memory element according to Embodiment 2.

In this Embodiment, as shown in FIG. 6 and FIG. 7, after first electrode 203 is formed on the surface of substrate 202 in the "first electrode formation step" (FIG. 7(a)), oxide semiconductor layer 204a the resistance of which is altered depending on the applied voltage is formed on the first electrode 203 in an "oxide semiconductor layer formation step" (FIG. 7(b)); ferritin 205 constituted with metal compound core 205a and protein 205b on the external side thereof is arranged on the oxide semiconductor layer 204a in a "ferritin arranging step" (FIG. 7(c)); protein 205b on the external side of the ferritin 205 is removed to modify the metal compound core 205a into metal nanoparticle 204b in a "protein removal and core modification step" (FIG. 7(d)); tunnel barrier layer 204c is formed on the oxide semiconductor layer 204a and on the metal nanoparticles 204b in a "tunnel barrier layer formation step" (FIG. 7(e)); and second electrode 206 is formed on the tunnel barrier layer 204c in the "second electrode formation step".

In this Embodiment, metal nanoparticles are formed from the metal compound core inside ferritin. Since the size of the internal space of apoferritin is uniform, the metal compound core size also becomes uniform. As a consequence, a feature enabling metal nanoparticles with uniform particle size to be readily arranged is achieved. In addition, it is advantageous in that metal nanoparticles can be arranged with uniform density even on a surface having a large area, and adsorption density of the metal nanoparticles can be easily controlled by changing the conditions of the solution in adsorption.

Figure 1:
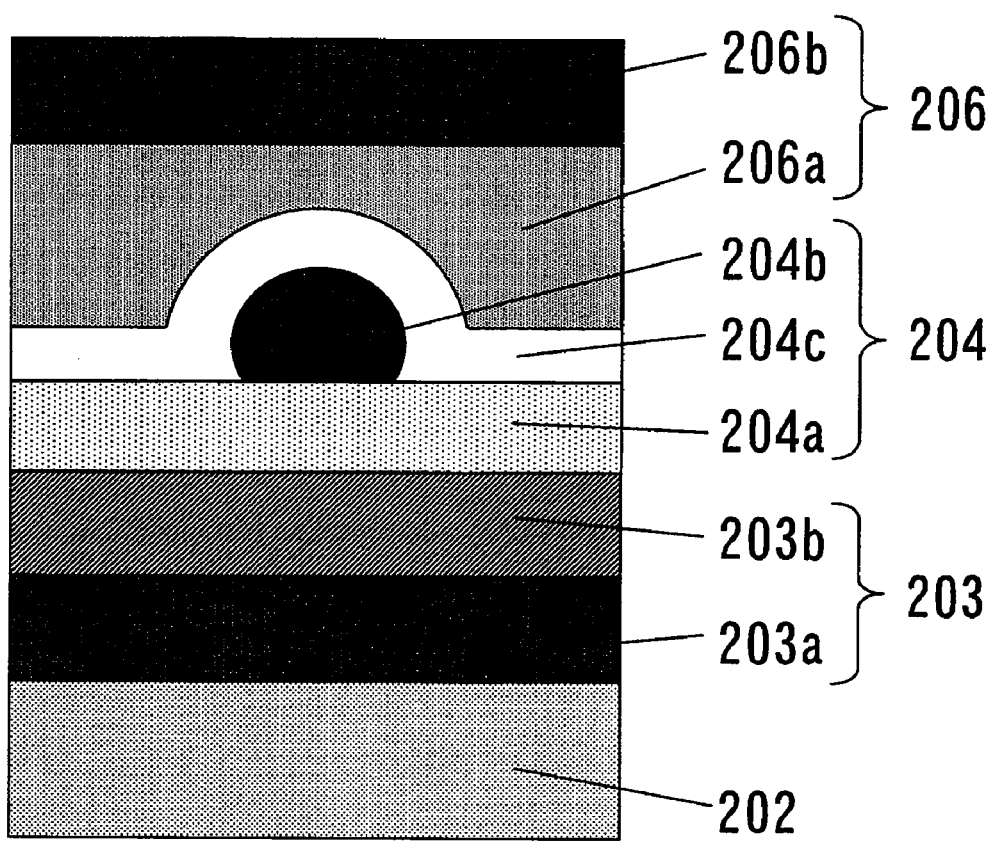
FIG. 1 shows a cross-sectional view illustrating a resistive nonvolatile memory element according to Embodiment 1.
Figure 2:
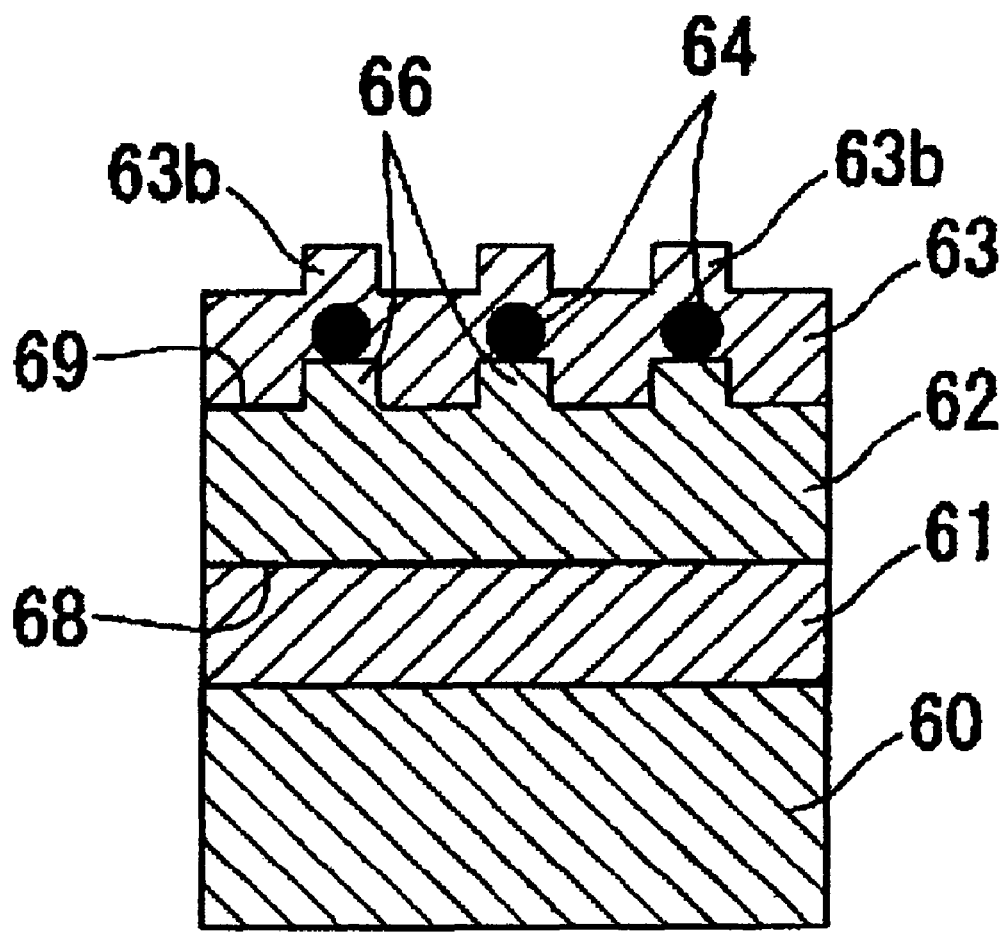
FIG. 2 shows a cross-sectional view illustrating a resistive nonvolatile memory element according to Prior Art disclosed in Patent Document 1.
Figure 3:
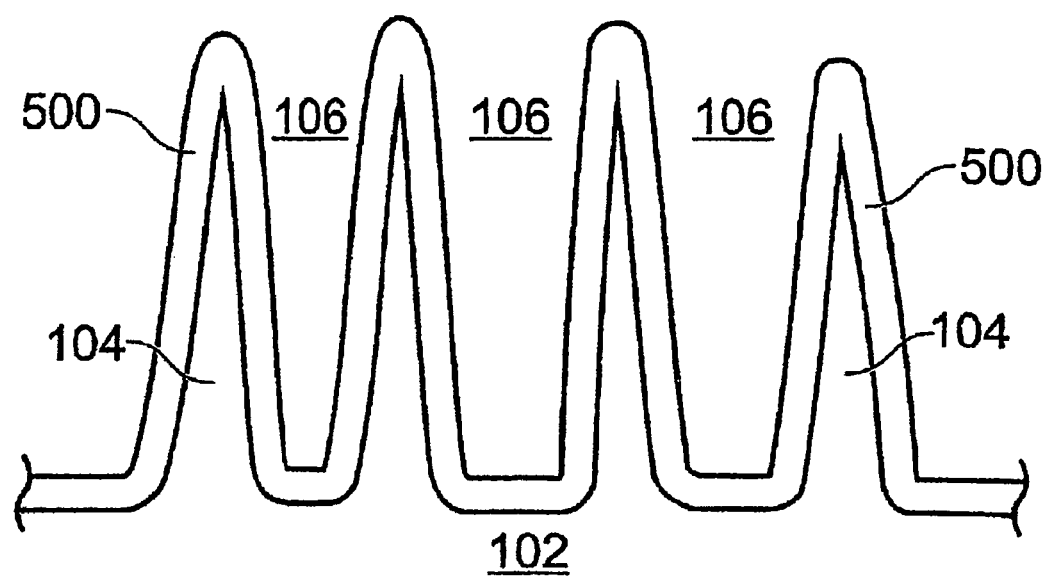
FIG. 3 shows a cross-sectional view illustrating a resistive nonvolatile memory element according to Prior Art disclosed in Patent Document 2.
Figure 4:
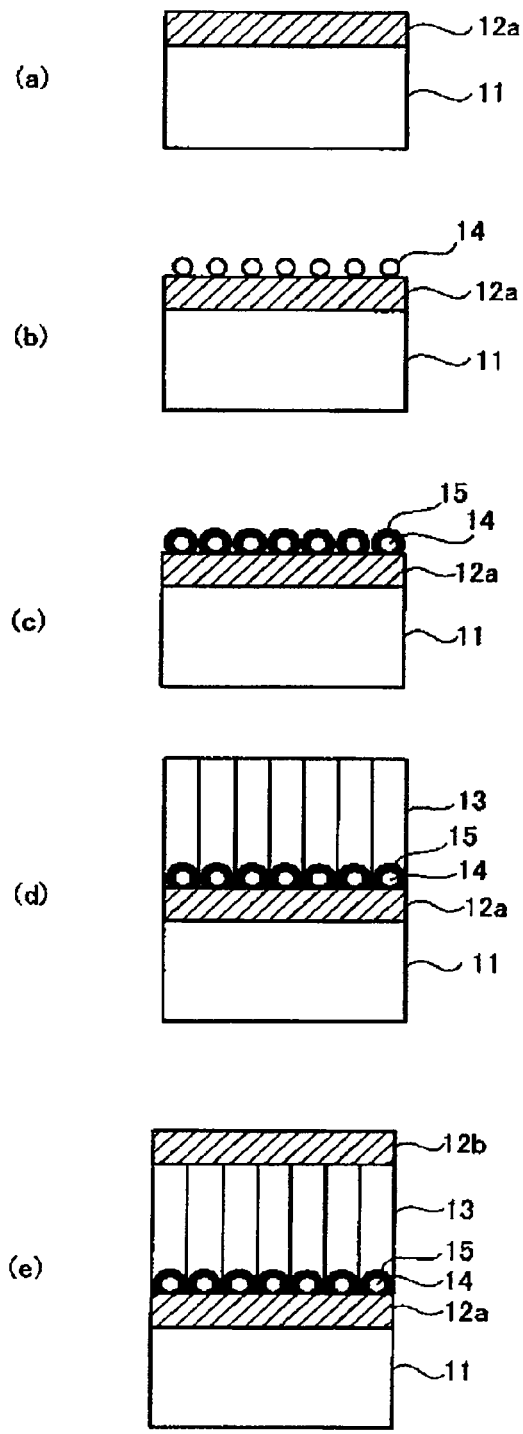
FIG. 4 shows the first cross-sectional view illustrating a resistive nonvolatile memory element according to Prior Art disclosed in Patent Document 4.
Figure 5:
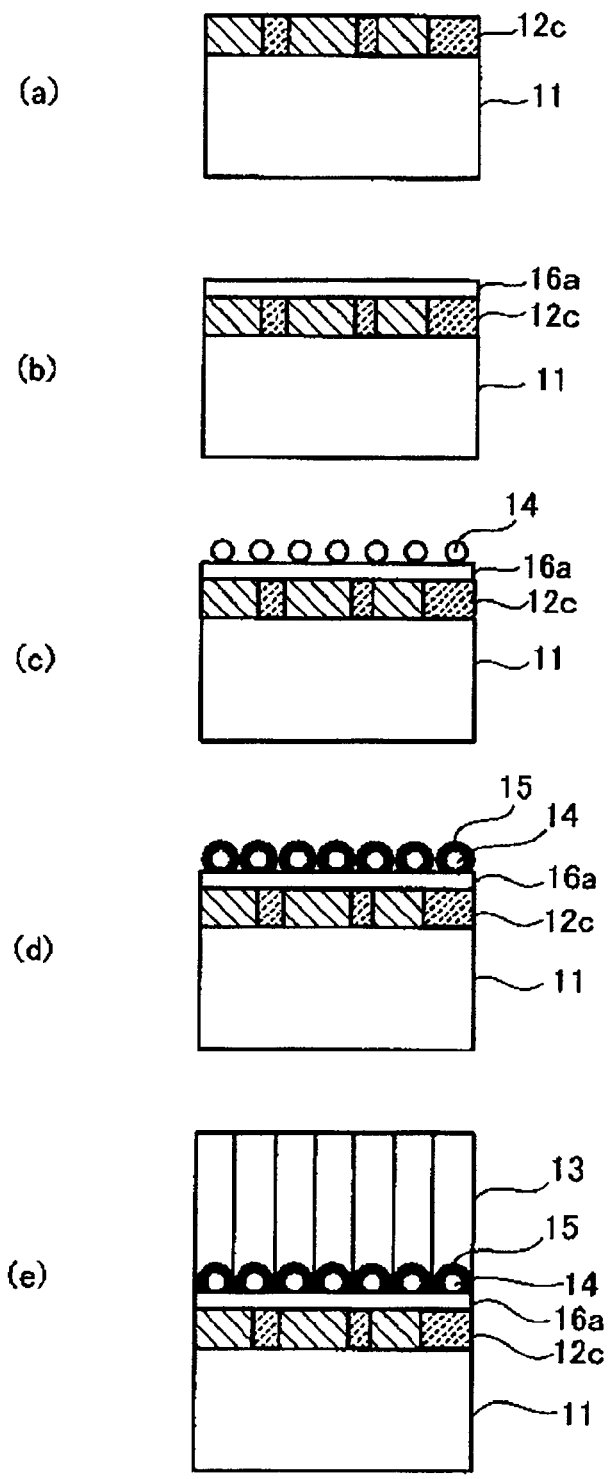
FIG. 5 shows the second cross-sectional view illustrating a resistive nonvolatile memory element according to Prior Art disclosed in Patent Document 4.

As shown in the cross-sectional view in FIG. 1, the resistive nonvolatile memory element 201 of the present invention includes first electrode 203 on substrate 202, oxide semiconductor layer 204a the resistance of which is altered depending on the applied voltage and which was formed on the first electrode 203, metal nanoparticles 204b having a diameter of 2 to 10 nm and being arranged on the oxide semiconductor layer 204a, tunnel barrier layer 204c formed on the oxide semiconductor layer 204a and on the metal nanoparticles 204b, second electrode 206 formed on the tunnel barrier layer 204c. In this configuration, the oxide semiconductor layer 204a, the metal nanoparticle 204b, and the tunnel barrier layer 204c, as a whole, constitute the resistive region 204.

The density of the tunnel electric current that flows via the tunnel barrier layer 204c greatly depends on the density of states of the material, which sandwiches the tunnel barrier layer 204c, at around the Fermi level. The density of states of a metal at around the Fermi level is greater as compared with the density of states of electrons of the resistance-altering material at around the Fermi level. Therefore, when the same electric potential difference is applied, the electric current density between the metal nanoparticle 204b and the second electrode 206 becomes higher as compared with the electric current density between the oxide semiconductor layer 204a and the second electrode 206 in the region where any metal nanoparticle is absent.

In other words, the tunnel resistance between the metal nanoparticle 204b and the second electrode 206 becomes lower as compared with the tunnel resistance between the oxide semiconductor layer 204a and the second electrode 206, whereby similar effects exhibited upon formation of a virtual electric current path immediately on the metal nanoparticles 204b are achieved. Since the metal nanoparticles 204b are in contact with the oxide semiconductor layer 204a, the electric field intensity at the bottom of the metal nanoparticles 204b in the oxide semiconductor layer 204a becomes greater than the electric field intensity in the region where any metal nanoparticle 204b is absent in the oxide semiconductor layer 204a as a result of foregoings, whereby concentration of electric field toward the metal nanoparticle 204b bottom is caused.

When the metal nanoparticles 204b are not in contact with the oxide semiconductor layer 204a, concentration of electric field toward the metal nanoparticle 204b bottom is not caused. Therefore, it is necessary that the metal nanoparticles 204b are in contact with the oxide semiconductor layer 204a in both electric and physical aspects.

Explanation of the differences is now made between the disclosures in Patent Document 6 and Patent Document 7, and the present invention.

Figure 8:
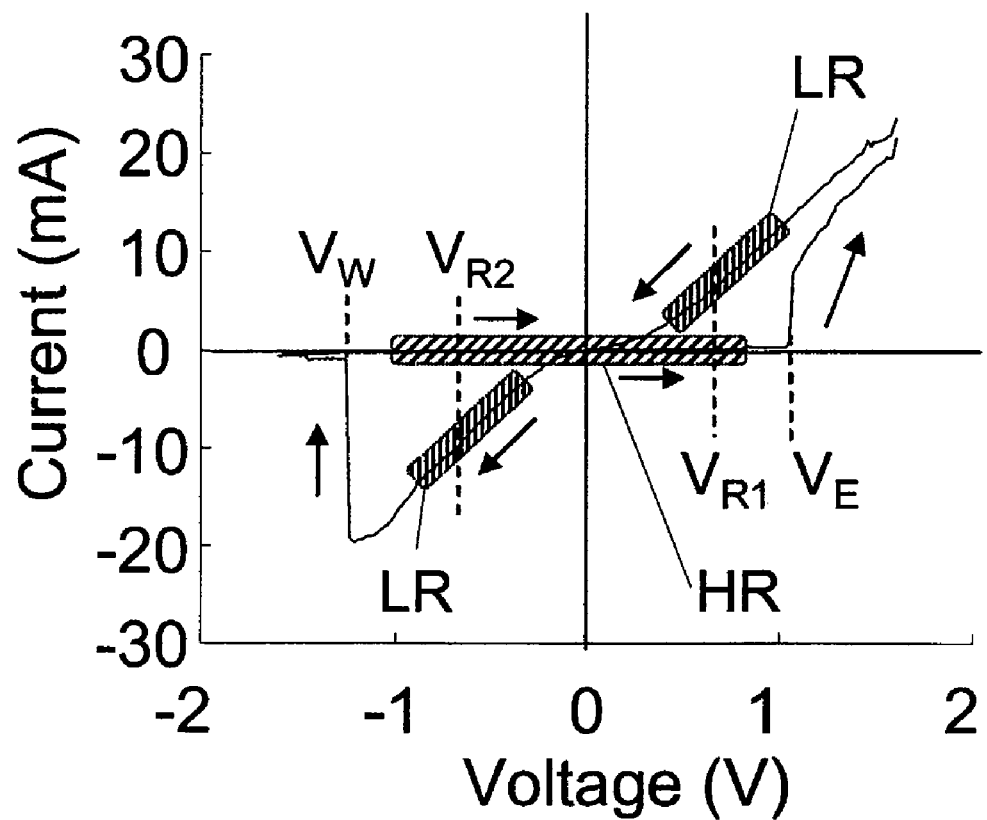
FIG. 8 shows a view illustrating an electric characteristic of a resistive nonvolatile memory element according to Example 1.
Figure 14:
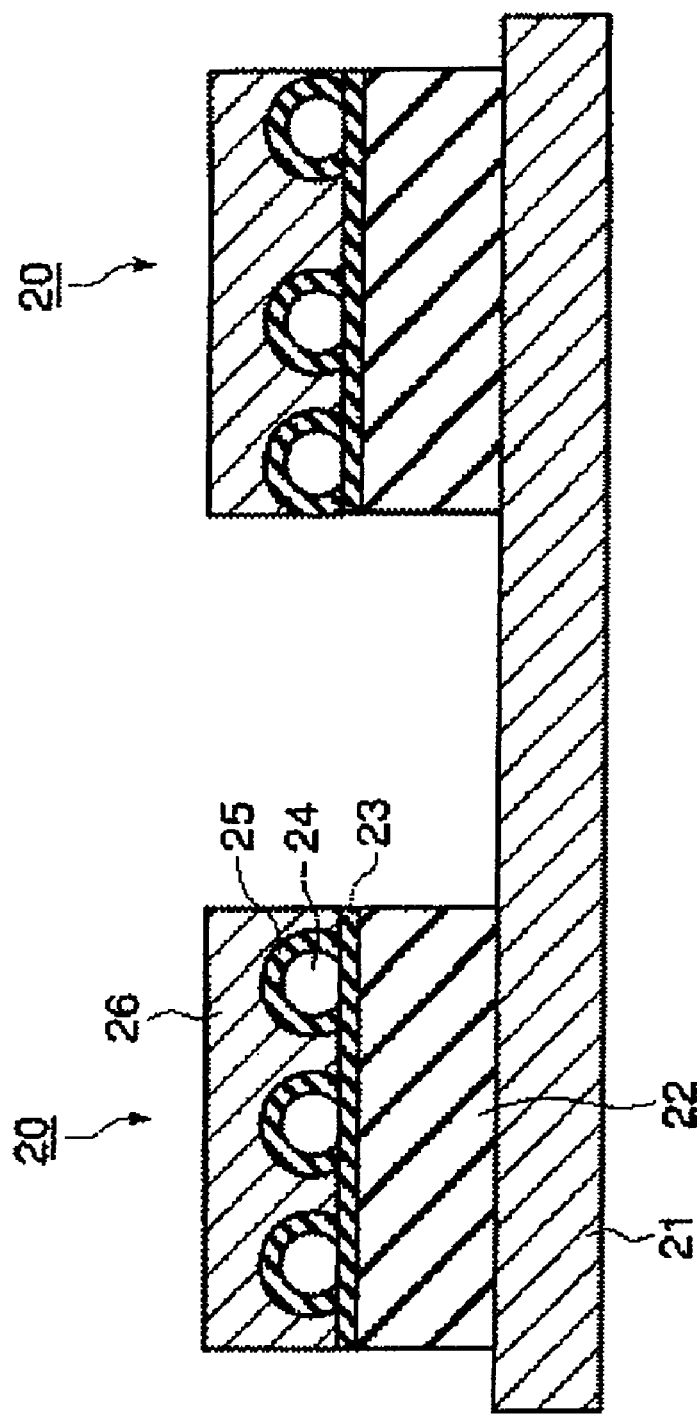
FIG. 14 shows a view illustrating FIG. 8 in Patent Document 6.

FIG. 14 shows the same drawing as that in FIG. 8 of Patent Document 6. FIG. 8 of Patent Document 6 illustrates a nonvolatile memory element including first conductive part 21, trap insulating film 22 constituted with a silicon nitride film, first tunnel barrier layer 23, electrically conductive fine particle 24 constituted with silicon, second tunnel barrier layer 25, and second conductive part 26 in this order, in which the first tunnel barrier layer 23 and the second tunnel barrier layer 25 enwrap the electrically conductive fine particle 24. According to Patent Document 6, such a nonvolatile memory element utilizes a coulomb blockade effect, i.e., a phenomenon of confinement of single electron in a certain place (herein, in the electrically conductive fine particle 24). More specifically, the nonvolatile memory element is effected by alteration of the electric resistance between the state in which the electron is confined in the electrically conductive fine particle 24, and the state in which the electron is not confined (i.e., state in which the electron is not present in the electrically conductive fine particle 24). In other words, it is essential that the first tunnel barrier layer 23 and the second tunnel barrier layer 25 enwrap the electrically conductive fine particle 24 in order to achieve the coulomb blockade effect, and that the electrically conductive fine particle 24 is spaced apart from and insulated from the trap insulating film 22 in Patent Document 6.

Moreover, Patent Document 7, in paragraph numbers 0065 to 0066, suggests as a combination of a trap insulating film with fine particles that cause the coulomb blockade effect, a combination of titanium oxide with gold (or platinum), in addition to a combination of silicon with silicon nitride.

However, the difference between the present invention and the invention disclosed in Patent Document 6 is that the electrically conductive fine particle 24 must be spaced apart from and insulated from the trap insulating film 22 by necessity in Patent Document 6, in contrast to the present invention in which contact of the metal nanoparticle 204b with the oxide semiconductor layer 204a is essentially required. Granted that the first tunnel barrier layer 23 does not exist, and that the electrically conductive fine particles 24 are in contact with the trap insulating film 22 in an electrical and physical manner in Patent Document 6, it is impossible to confine the electron in the electrically conductive fine particle 24. Under such circumstances, it would be clear that the present invention is obvious over Patent Documents 6 and 7. In this respect, Comparative Example 3 described later should be also taken into consideration.

Explanation of the present invention is made further.

Locally concentrated electric field leads to triggering of formation of an electric current path (low resistance region) in changing the element into a low resistance state. Accordingly, an application voltage required in the process of applying a high voltage (forming process) for initially forming the electric current path after producing the element can be reduced, or the need of such a forming process is eliminated.

For example, a local threshold value of electric field intensity when the resistive layer starts to change into the low resistance state in an initial stage on the interface where the electric current path is formed is defined as Ec. For first writing to allow for the low resistance state (or formation) in a homogenous element, application of a voltage of not less than the element voltage Vc that results in Ec on the interface, as a whole, is required. On the other hand, in an element having an electric field-concentrating effect with an electric field concentration factor of $\beta$ ($\beta>1$), the local electric field intensity exceeds Ec in the region where the electric field concentrates when the element voltage exceeds Vc/$\beta$, whereby formation of the electric current path is started. Therefore, in the element accompanied by electric field concentration, the electric current path can be formed with the lower applied voltage. As a result, a writing voltage required for changing into a first low resistance state is reduced, and thus an effect of reducing the forming voltage, or eliminating the need of a forming process can be exhibited.

It is known that the tunnel electric current that flows through a tunnel barrier layer has an influence on the tunnel barrier layer due to electric current stress, and thus tends to deteriorate the insulation property. Therefore, it is also advantageous in that when an electric current path of the initial stage is formed once in the metal nanoparticle region, the tunnel resistance at the top of the metal nanoparticles is further reduced by the tunnel electric current itself, and as a consequence, the electric current constriction is further enhanced.

In a structure without having a local concentration of the electric field, formation of low resistance region is initiated incidentally inside the cell in a region where the electric current flows comparatively easily in first writing to change into the low resistance state (or forming). The position and size (cross sectional area with respect to the electric current in the low resistance region) of the electric current path thus formed consequently may be altered by influences from fine roughness of the interface as well as fluctuation of the composition, and the like. This may be a cause for variation of characteristics of the element. According to the structure of the present invention, the electric field is concentrated toward the metal nanoparticle region, therefore, the position and uniform size of the formed electric current path can be coordinated, whereby the variation of the characteristics described above can be prevented.

Also, in a structure in which the electric current is not constricted, the size of the low resistance region (cross sectional area with respect to the electric current) formed in changing the resistive layer into the low resistance state during the writing/erasing operation expands greater than usual due to the difference and the like of the film state inside the element, whereby the resistance of the region may be too low. In order to change the expanded low resistance region into a high resistance state, a voltage or an electric current that is higher than usual may be required, which can be the cause of variation of characteristics and operation failure of the element. Since the electric current path is constricted in the vicinity of the metal nanoparticles in the structure of the present invention, expansion in the low resistance region is suppressed, and thus variation of characteristics and operation failure as described above can be prevented.

In order to cause concentration of electric field by the shape effect disclosed in the prior arts, it is necessary to form a sharply projecting shape having a high aspect ratio. Also, since the extent of concentration of electric field greatly varies depending on slight alteration of the shape (curvature radius) of the top of the projection, a process technique with high accuracy and high reproducibility has been desired for obtaining uniform characteristics in a large number of elements.

In the present invention, since the difference of tunnel resistances resulting from the difference in density of the electric states between the oxide semiconductor layer and the metal nanoparticles is mainly utilized, it is not necessary to elaborate a sharp projecting shape with high accuracy. In the present invention, an electric field concentrated in a microregion can be formed by a simple process, and as a result, a minute electric current path can be formed.

As the metal nanoparticle 204b, for example, nanoparticles constituted with gold or platinum may be used.

The metal nanoparticle 204b having a diameter of less than 10 nm is preferred since a plurality of nanoparticles can be arranged even on a 25-nm micro-fabricated resistive cell which will be demanded in future. By arranging a plurality of nanoparticles on the cell, other electric current path can perform a function, therefore, reliability can be secured even if operation of a part of the electric current path fails.

In addition, the diameter of the metal nanoparticle 204b is preferably more than 2 nm, since uniform nanoparticles can be readily arranged using colloid particles. Furthermore, the diameter of the metal nanoparticle is preferably between 3 nm and 5 nm since the nanoparticles can be easily produced using a cage-type protein such as Listeria ferritin or ferritin.

As the tunnel barrier layer 204c, for example, a silicon oxide layer can be utilized.

The tunnel barrier layer 204c has a film thickness of preferably less than 5 nm, since transmission of a tunnel electric current can be effected efficiently.

In addition, the film thickness of the tunnel barrier layer 204c is preferably more than 1 nm, since leakage of the electric current can be suppressed in a region where any metal nanoparticle is absent.

The material of the oxide semiconductor layer 204a may be, for example, nickel oxide, iron oxide, cobalt oxide, titanium oxide, chromium oxide, silicon oxide, aluminum oxide, hafnium oxide, magnesium oxide, yttrium oxide, $PrCaMnO_3$, $LaSrMnO_3$, $BaSrMnO_3$, Cr-doped $SrTiO_3$, Cr-doped $PbTiO_3$, GeSbTe or the like.

Example 1

Hereinafter, a method for production of the resistive nonvolatile memory element of the Example 1 is explained in detail.

Introduction of Gold Sulfide Core into Apoferritin

Operation for introducing a gold sulfide core into a cavity inside apoferritin is first explained below.

First, 17 mg of thiourea was added to 1 mL of a 20 mM potassium chloroaurate ($KAuCl_4$) solution, followed by mixing.

Several minutes later, thus yielded yellowish solution of an Au (III) ion was turned to a colorless transparent solution of a Au (I)-thiourea complex, and the solution was adjusted to a 20 mM gold thiourea complex solution.

Next, in a phosphate buffer (pH 8), a solution of purified apoferritin derived from horse, and the aforementioned gold thiourea complex solution were mixed.

In this step, the resultant final mixed solution was adjusted to have a phosphate buffer concentration of 50 mM, a thiourea concentration of 3 mM, and a concentration of apoferritin derived from horse of 0.5 mg/mL.

In order to complete the reaction of incorporation of the gold sulfide into apoferritin, the mixed solution was left to stand as was overnight.

This operation enables gold sulfide to be introduced into a holder portion of apoferritin, whereby gold sulfide ferritin (complex of apoferritin with gold sulfide fine particle) was produced.

Next, the mixed solution was charged in a vessel, and subjected to centrifugal separation using a centrifugal separator under conditions at 10,000 revolutions per minute for 15 to 30 min to remove the precipitate. Subsequently, the supernatant obtained after removal of the precipitate was further subjected to centrifugal separation under conditions at 10,000 revolutions per minute for 30 min.

In this step, soluble gold sulfide ferritin is dispersed in the supernatant, while aggregated ferritin gold sulfide is precipitated in the form of an aggregate.

Purification of Ferritin Having Gold Core Introduced Therein

The solvent of the supernatant of the ferritin solution including the metal sulfide therein obtained as described above was concentrated using an ultrafiltration film [Amicon Ultra-15 (NMWL: 50,000)], and thus concentrated ferritin fraction was further purified by loading on Sephacryl S-300 (gel filtration column) equilibrated with a 50 mmol/L Tris(2-Amino-2-(hydroxymethyl)-1,3-propanediol) buffer (pH 8) at 25° C., and carrying out column chromatography.

Accordingly, an eluate was obtained in which the aggregate of ferritin particles was removed by the gel filtration column.

The eluate was then subjected to concentration of ferritin in the solution using an ultrafiltration film and an ultracentrifugal separation apparatus. Next, the concentrate was diluted with a buffer (pH 7) containing 110 mM MES (2-(4-Morpholino)ethanesulfonic acid) and 110 mM Tris(2-Amino-2-(hydroxymethyl)-1,3-propanediol). Such operations of concentration and dilution were repeated 3 times to 7 times, and a ferritin solution was finally obtained in which 0.2 mg/mL of ferritin (in terms of protein concentration) was dispersed in water.

First Electrode Formation Step

A p type silicon substrate, as substrate 202, having a resistivity of 10 to 100 Ocm, and having a thermal oxide film (not shown in the figure) with a thickness of 3 nm on the surface thereof. After this p type silicon substrate 202 was washed, the substrate surface was cleaned by supplying an oxygen and ozone gas using an UV light/ozone treatment apparatus manufactured by Samco Inc. for 10 min, while irradiating a UV light at a substrate temperature of 110° C.

Furthermore, the substrate was placed in an electron beam vapor deposition apparatus, and the apparatus was vacuum drawn. Subsequently, a metal titanium film having a film thickness of 10 nm (not shown in the figure), a gold film having a film thickness of 100 nm as first first electrode 203a, and a metal titanium film having a film thickness of 10 nm as second first electrode 203b were formed on the substrate (FIG. 7(a)) by electron beam vapor deposition.

Oxide Semiconductor Layer Formation Step

After the thin film formation as described above, an ambient air was introduced into the electron beam vapor deposition apparatus, and the substrate was removed, to which an oxygen and ozone gas was further supplied using a UV light/ozone treatment apparatus for 10 min at a substrate temperature of 110° C. while irradiating a UV light, whereby the substrate surface was oxidized and hydrophilized. In this step, the surface of the metal titanium film formed on the substrate surface was oxidized, and a titanium oxide layer was formed on the surface thereof as the oxide semiconductor layer 204a (FIG. 7(b)).

Ferritin Arranging Step

The ferritin solution produced by the aforementioned purification step of ferritin was dropped on the substrate, and left to stand at room temperature for 30 min. Thus, ferritin 205 was adsorbed on the substrate surface. Thereafter, the substrate was washed in running pure water for 5 min, whereby excess unadsorbed ferritin was eliminated. The substrate after washing was dried, followed by baking at 110° C. for 3 min, and thus adsorbed ferritin 205 was immobilized on the substrate (FIG. 7(c)). The surface density of ferritin 205 was $3 \times 10^{11}$ particles/cm$^2$.

Protein Removal and Core Modification Step

The substrate on which ferritin had been arranged was placed in a UV light/ozone treatment apparatus, and while irradiating a UV light at a substrate temperature of 110° C., an oxygen and ozone gas was supplied and the state was kept for 20 min. Thus, the protein 205b on the external side of ferritin was removed. Also, the gold sulfide core 205a having a diameter of 6 nm inside the ferritin was reduced at the same time, whereby gold nanoparticles 204b having a diameter 5 nm were formed (FIG. 7(d)).

Tunnel Barrier Layer Formation Step

On the substrate surface including the aforementioned nanoparticles arranged thereon was formed a silicon oxide film layer having a thickness of 2 nm as tunnel barrier layer 204c, with a plasma CVD apparatus using a TEOS (tetraethoxysilane) material at a substrate temperature of 300° C. The film thickness of the silicon oxide film was evaluated using an ellipsometer provided that a refractive index was 1.46 (FIG. 7(e)).

Second Electrode Formation Step

A metal mask having a pattern with a diameter of 100 μm on the substrate surface was provided, and introduced into the electron beam vapor deposition apparatus again. The apparatus was vacuum drawn, and a platinum film having a film thickness of 10 nm was formed as the first second electrode 206a on the substrate by electron beam vapor deposition. In addition, a gold film having a film thickness of 100 nm was subsequently formed as the second second electrode 206 on the substrate (FIG. 7(f)) by electron beam vapor deposition.

According to the steps described above, a resistive nonvolatile memory element described below could be formed.

On the substrate 202 that is a p type semiconductor substrate were arranged first electrode 203 constituted with the first first electrode 203a and the second first electrode 203b. The first first electrode 203a was a gold layer having a film thickness of 100 nm, and the second first electrode 203b was a metal titanium layer having a film thickness of 10 nm.

On the first electrode 203 was formed a titanium oxide layer as oxide semiconductor layer 204a.

Furthermore, gold nanoparticles having a diameter of 5 nm were arranged as metal nanoparticle 204b with a density on the face of $3 \times 10^{11}$ particles/cm$^2$ on the top of the oxide semiconductor layer 204a.

Here, the metal nanoparticle 204b was in contact with the oxide semiconductor layer 204a.

On the top of these oxide semiconductor layer 204a and metal nanoparticle 204b was formed a silicon oxide film layer having a film thickness of 2 nm as the tunnel barrier layer 204c.

The aforementioned oxide semiconductor layer 204a, metal nanoparticle 204b, and tunnel barrier layer 204c, as a whole, constitute the resistive region 204.

Moreover, second electrode 206 was formed on the tunnel barrier layer 204c. In this Example, the second electrode exhibits a circular shape having a diameter of 100 μm. Further, the second electrode 206 was constituted with first second electrode 206a and second second electrode 206b. The first second electrode 206a was a platinum layer having a film thickness of 10 nm, and the second second electrode 206b was a gold layer having a film thickness of 100 nm.

FIG. 8 shows an electric characteristic of the resistive nonvolatile memory element of this Example 1 observed when a voltage was applied in the range of from −1.6 V to +1.6 V. In FIG. 8, the potential of the first electrode is presented along the direction of the axis of ordinate provided that the potential of the second electrode is assumed to be 0.

As is clearly shown in FIG. 8, the resistive nonvolatile memory element of this Example 1 exhibited a memory characteristic of the resistance of the element altered depending on the applied voltage. The electric current density required for operation of this element was less than 20 μA/μm$^2$, which was lower as compared with the electric current density (1 to 10 mA/μm$^2$) of the element of conventional resistive nonvolatile memory elements not having an electric current constriction structure.

In addition, the resistive nonvolatile memory element of this Example 1 did not require a forming process to be carried out in which a high voltage was applied at the initial stage.

Examples of the writing, erasing, and reading operations of the resistive nonvolatile memory element of this Example 1 are explained below.

Herein, a high resistance state of the present element is defined as "1", while a low resistance state is defined as "0". Moreover, the potential of the second electrode is defined to be 0. In FIG. 8, a part of the low resistance region is shown as LR, while a part of the high resistance region is shown as HR. Additionally, in FIG. 8, the voltage at which the change from the low resistance state to the high resistance state is initiated during applying a negative voltage to the first electrode is presented as $V_W$, while the voltage at which the change from the high resistance state to the low resistance state is initiated during applying a positive voltage is presented as $V_E$.

When the present element is in the low resistance state "0", the state is changed into the high resistance state "1" by applying to the first electrode as a writing voltage, a negative voltage equal to or lower than $V_W$ (greater in terms of the absolute value) to elevate the resistance value of the element (first writing). In addition, when the present element is in the high resistance state "1", the state is changed into the low resistance state "0" by applying to the first electrode as a writing voltage (or erasing voltage), a positive voltage equal to or greater than $V_E$ to lower the resistance value of the element (second writing). By repeating these steps, the low resistance state "0" and the high resistance state "1" can be reversibly changed, whereby writing and erasing of the information to the element are enabled.

In reading, a reading voltage or a reading electric current which does not alter the resistance state of the present element, but enables reading of the resistance state is applied between the first electrode and the second electrode, whereby the resistance state of the present element can be specified.

For example, the resistance state can be specified without altering the resistance state of the element by applying to the first electrode a positive reading voltage that does not reach $V_E$, for example, $V_{R1}$ ($0<V_{R1}<V_E$) in FIG. 8, and reading the electric current value. Alternatively, the resistance state can be also specified without altering the resistance state of the element by applying to the first electrode a negative voltage that is greater than $V_W$ (smaller in terms of the absolute value), for example, $V_{R2}$ ($V_W<V_{R2}<0$) in FIG. 8, and reading the electric current value.

Also, in another reading method, a reading voltage is applied to the wiring connected to the first electrode (or second electrode) of the present element to charge the wiring capacity, the wiring potential can be measured after a certain time period. Because the electric current values that flow the element are different between the high resistance state and the low resistance state of the element, thereby leading to different speed of alteration of the wiring potential. Therefore, output of the recording state of the element can be executed by comparing a wiring potential after a certain time period with a standard potential. In this process, when the potential $V_R$ of the first electrode with respect to the potential of the second electrode falls within the range of $V_W<V_R<V_E$, reading can be executed without destroying the recording state. Alternatively, without using the standard potential, output of the recording state of the element can be also executed by using two elements of the present invention as a pair to compare with the potential of the wiring connected to the element for comparison conditioned to have a reverse resistance state.

In still another reading method, the output of the recording state of the element can be executed by allowing a certain level of electric current to flow between the first electrode and the second electrode, and comparing the resulting electromotive force then with a standard potential. In this process, by using a reading electric current which allows the potential $V_R$ of the first electrode with respect to the potential of the second electrode to fall within the range of $V_W<V_R<V_E$ even in the high resistance state, reading can be executed without destroying the recording state. Alternatively, without using the standard potential, output of the recording state of the element can be also executed by using two elements of the present invention as a pair to compare with the electromotive force generated in the element for comparison conditioned to have a reverse resistance state.

The operation as described above enables the information to write on, erase from, and read out the present element. Additionally, since the resistance state of the present element is unchanged without applying a voltage, the written or erased information is retained without supply of the power, thereby enabling use as a nonvolatile memory.

In this Example, changes into the low resistance state and into the high resistance state, i.e., writing, erasing operations are attempted by application of a voltage in the range of ±1.6 V. However, as shown in FIG. 8, $V_W$ is −1.2 V, and $V_E$ is 1.1 V in the Example 1. Since the absolute values of both $V_W$ and $V_E$ in this Example are less than 1.3 V, writing and erasing can be executed at a low voltage of less than ±1.3 V, i.e., with the absolute value of less than 1.3 V. In micro-fabricated integrated circuits, elements that operate at an inner voltage of 1.3 V are often used. Therefore, the element according to the present invention not only can reduce the electric power consumption by driving at a low voltage, but also can be readily driven in micro-fabricated integrated circuits.

Now, the difference between the operation of the element disclosed in Patent Document 6, and the operation of the element according to the present invention is explained.

According to the context of Patent Document 6, when a positive voltage is applied to a conductive part not being in contact with fine particles (conductive part 21 in FIG. 8 of Patent Document 6) with respect to the conductive part being in contact with the fine particles (conductive part 26 in FIG. 8 of Patent Document 6) in the element disclosed in Patent Document 6, the electrons are trapped in a trap in the vicinity of the electrically conductive fine particles (electrically conductive fine particles 24 in FIG. 8 of Patent Document 6), whereby the electric current value is decreased (while the resistance value is increased). In regard to this operation, since the relationship between alterations of the polarity and resistance of the applied voltage is in reverse as compared to the operation of the element according to the present invention described above, distinct operation of the element of the present invention from that of the element disclosed in Patent Document 6 is proven.

Example 2

Hereinafter, a method for producing the resistive nonvolatile memory element of the Example 2 is explained in detail.

Introduction of Platinum Sulfide Core into Apoferritin

Operation for introducing a platinum sulfide core into apoferritin is explained below.

First, 0.85 mL of a 100 mg/mL thiourea solution, 1 mL of a 100 mM potassium chloroplatinate (II) ($K_2(PtCl_4)$) solution, and 0.15 mL of pure water were mixed to prepare a 50 mM platinum thiourea complex solution.

Next, in a phosphate buffer (pH 8), a solution of purified apoferritin derived from horse, and the aforementioned platinum thiourea complex solution were mixed.

In this step, the resultant final mixed solution was adjusted to have a phosphate buffer concentration of 50 mM, a thiourea concentration of 3 mM, and a concentration of apoferritin derived from horse of 0.5 mg/mL.

In order to complete the reaction of incorporation of the platinum sulfide into apoferritin, the mixed solution was left to stand as was overnight.

This operation enables platinum sulfide to be introduced into a holder portion of apoferritin, whereby platinum sulfide ferritin (complex of apoferritin with platinum sulfide fine particle) was produced.

Next, the mixed solution was charged in a vessel, and subjected to centrifugal separation using a centrifugal separator under conditions at 10,000 revolutions per minute for 15 to 30 min to remove the precipitate. Subsequently, the supernatant obtained after removal of the precipitate was further subjected to centrifugal separation under conditions at 10,000 revolutions per minute for 30 min.

In this step, soluble platinum sulfide ferritin was dispersed in the supernatant, while aggregated ferritin platinum sulfide was precipitated in the form of an aggregate.

Purification of Ferritin Having Platinum Core Introduced Therein

The solvent of the supernatant of the ferritin solution including the platinum sulfide therein obtained as described above was concentrated using an ultrafiltration film [Amicon Ultra-15 (NMWL: 50,000)], and thus concentrated ferritin fraction was further purified by loading on Sephacryl S-300 (gel filtration column) equilibrated with a 50 mmol/L Tris(2-Amino-2-(hydroxymethyl)-1,3-propanediol) buffer (pH 8) at 25° C., and carrying out column chromatography.

Accordingly, an eluate was obtained in which the aggregate of ferritin particles was removed by the gel filtration column.

The eluate was then subjected to concentration of ferritin in the solution using an ultrafiltration film and an ultracentrifugal separation apparatus. Next, the concentrate was diluted with a buffer (pH 5.8) containing 20 mM MES (2-(4-Morpholino)ethanesulfonic acid) and 6 mM Tris(2-Amino-2-(hydroxymethyl)-1,3-propanediol). Such operations of concentration and dilution were repeated 3 times to 7 times, and a ferritin solution was finally obtained in which 0.2 mg/mL of ferritin (in terms of protein concentration) was dispersed in water.

After the aforementioned procedure, each step of the first electrode formation step, the oxide semiconductor layer formation step, the ferritin arranging step, the protein removal and the core modification step, the tunnel barrier layer formation step, and the second electrode formation step described in Example 1 was carried out.

The surface density of ferritin in the ferritin arranging step was $1 \times 10^{11}$ particles/cm$^2$. Further, in the protein removal and core modification step, platinum nanoparticles having a diameter of 5 nm were formed.

According to the steps described above, a resistive nonvolatile memory element described below could be formed.

Although the resistive nonvolatile memory element of Example 2 has almost the same structure to that of the resistive nonvolatile memory element of Example 1, not gold nanoparticles but platinum nanoparticles were arranged as the metal nanoparticle 204b. The platinum nanoparticle had a diameter of 5 nm, and a density on the face was $1 \times 10^{11}$ particles/cm$^2$.

Figure 9:
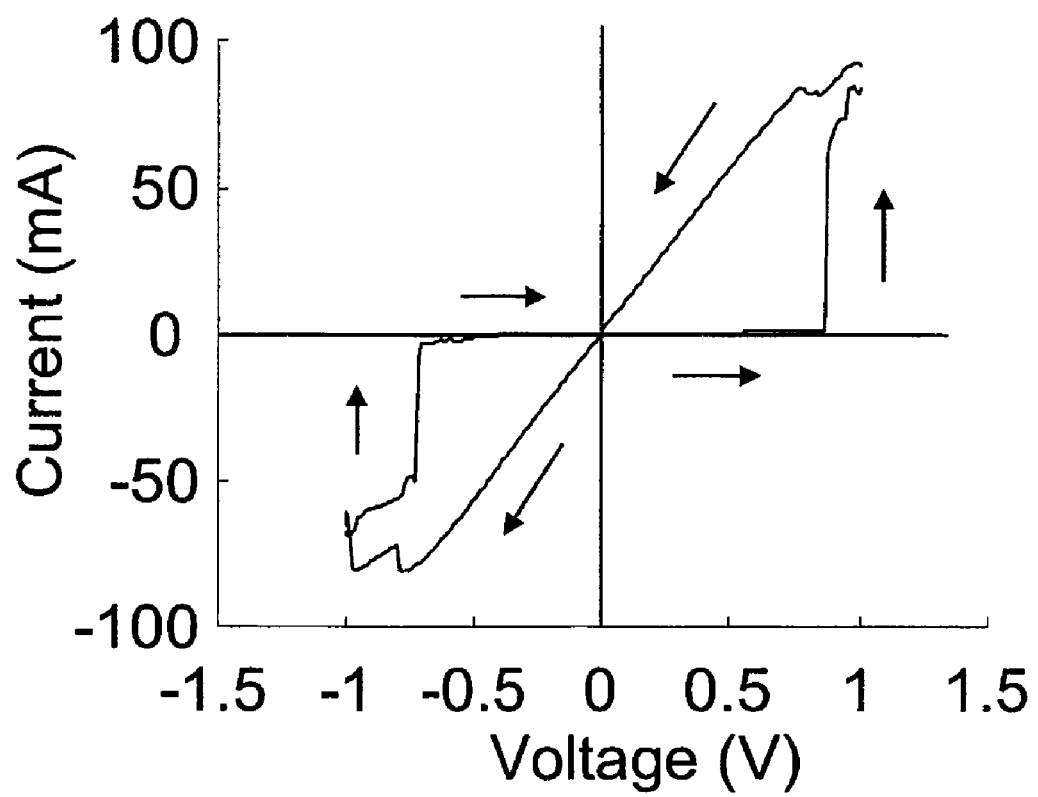
FIG. 9 shows a view illustrating an electric characteristic of a resistive nonvolatile memory element according to Example 2.

FIG. 9 shows an electric characteristic of the resistive nonvolatile memory element of this Example 2 observed when a voltage was applied in the range of from −1 V to +1 V.

As is clearly shown in FIG. 9, the resistive nonvolatile memory element of this Example 2 exhibited a memory characteristic of the resistance of the element altered depending on the applied voltage.

In addition, the resistive nonvolatile memory element of this Example 2 did not require a forming process to be carried out in which a high voltage was applied at the initial stage.

Also the resistive nonvolatile memory element of this Example 2 can execute writing, erasing, and reading by the same operation to that described in Example 1.

Further, as shown in FIG. 9, $V_W$ is −1.0 V, and $V_E$ is 0.9 V in the Example 2. Since the absolute values of both $V_W$ and $V_E$ in this Example are less than 1.1 V, writing and erasing can be executed at a low voltage of ±1.1 V. In micro-fabricated integrated circuits for low-electric power consumption use, elements that operate at an inner voltage of 1.1 V are often used. Therefore, the element according to the present invention not only can reduce the electric power consumption by driving at a low voltage, but also can be readily driven in micro-fabricated integrated circuits for low-electric power consumption use.

As suggested from the Example 1 and Example 2 described above, driving of writing and erasing can be executed by applying a voltage of from 1.1 V to 1.6 V in terms of the absolute value, according to the present invention. In addition, it is further preferred that the driving of writing and erasing be executed by applying a voltage of from 1.1 V to 1.3 V, whereby driving in a micro-fabricated integrated circuit is facilitated.

Comparative Example 1

The element of Comparative Example 1 was also configured to have almost the same structure as that of the resistive nonvolatile memory element of Example 1, but the tunnel barrier layer 204c was not arranged.

Figure 10:
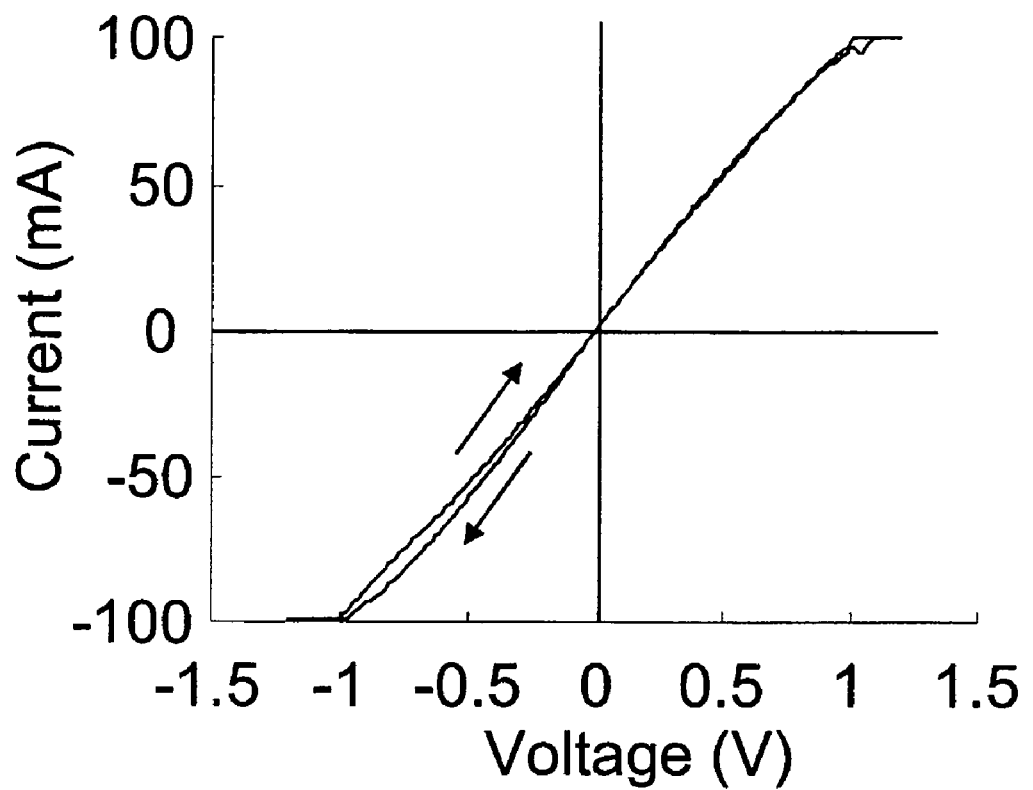
FIG. 10 shows a view illustrating an electric characteristic of a resistive nonvolatile memory element according to Comparative Example 1.

FIG. 10 shows an electric characteristic of the resistive nonvolatile memory element of Comparative Example 1 observed when a voltage was applied in the range of from −1.2 V to +1.2 V.

As is clearly shown in FIG. 10, the memory characteristic was not achieved with the element of Comparative Example 1 on which the tunnel oxide film 204c was not arranged. The aforementioned structure is similar to the element structure, which has been employed in conventional resistive memory elements, without having any electric current constriction structure. However, the size of the present element is as large as having a diameter of 100 nm. Therefore, it is necessary to allow an electric current of as large as more than 7 A to flow for achieving the electric current density (1 to 10 mA/μm$^2$) of the conventional elements without having an electric current constriction structure. It is believed that sufficient electric current density could not be achieved since the application of the electric current in this study was carried out in the range of ±100 mA, whereby the operation of resistance alteration failed.

Comparative Example 2

The element of Comparative Example 2 was also configured to have almost the same structure as that of the resistive nonvolatile memory element of Example 1, but the metal nanoparticles 204b were not arranged.

Figure 11:
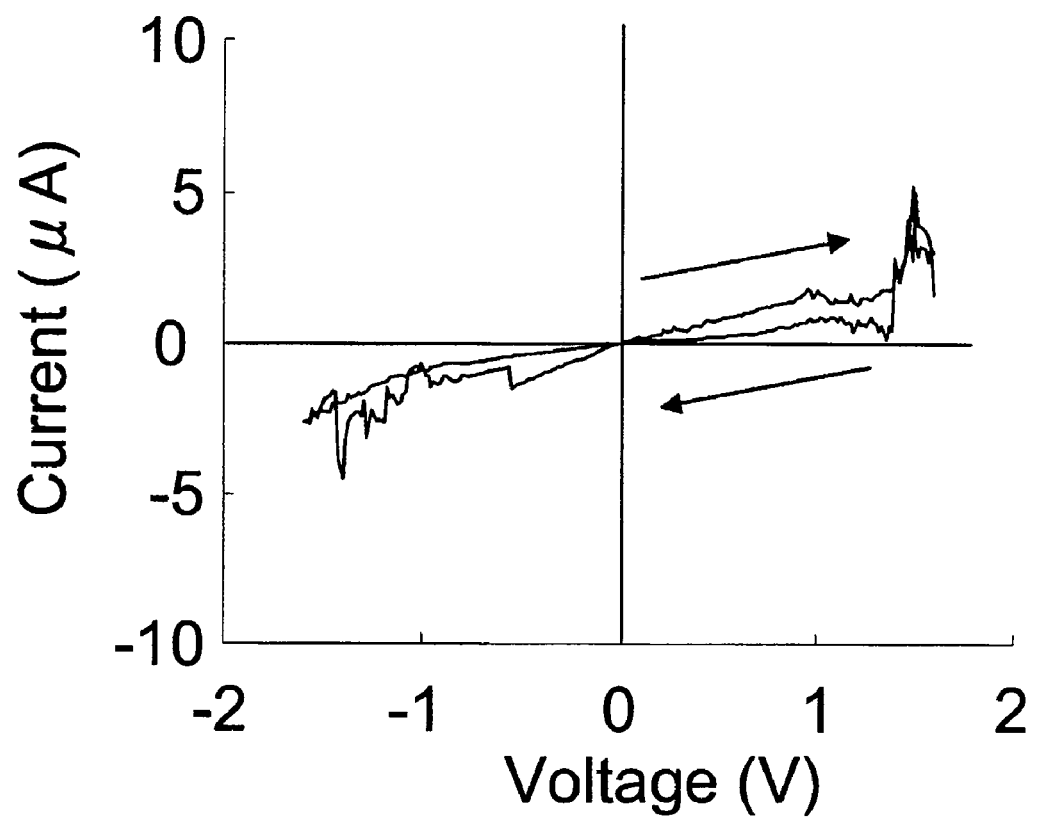
FIG. 11 shows a view illustrating an electric characteristic of a resistive nonvolatile memory element according to Comparative Example 2.

FIG. 11 shows an electric characteristic of the resistive nonvolatile memory element of Comparative Example 2 observed when a voltage was applied in the range of from −1.6 V to +1.6 V.

As is clearly shown in FIG. 11, the memory characteristic was not achieved with the element of Comparative Example 2 on which the metal nanoparticles 204b were not arranged, which exhibited a high resistance value.

The electric current density shown in FIG. 11 was less than 1/1000 of the electric current density in the low resistance state of Example 1, and the high resistance state was proven that which exhibited a higher resistance even in comparison with the high resistance state of Example 1. In addition, in the measurement scope (±1.6 V), change from the high resistance state to the low resistance state could not be observed.

For reference, even though the configuration of the Comparative Example 2 is employed, when a still higher voltage is applied, alteration of the resistance to change into the low resistance state can be expected due to an electric current that flows toward the oxide semiconductor from the upper electrode via the tunnel barrier layer at any position inside the cell. However, since the effect of the concentration of electric field and electric current constriction is not exhibited by the Comparative Example 2, benefit from the present invention fails, that is, the effects of reduction in electric power consumption, prevention of variation of the characteristics, as well as elimination of the need for forming or reduction in forming voltage may not be exhibited.

As is clear from FIG. 11, application of a forming voltage exceeding at least 1.6 V in terms of the absolute value, or application of a writing voltage for changing into the low resistance state is required in order to cause the change in resistance to provide the low resistance state in the Comparative Example 2.

From the results of Comparative Examples 1 and 2, it is comprehended that the metal nanoparticle 204b and the tunnel barrier layer 204c are essential in the present invention.

Comparative Example 3

Figure 12:
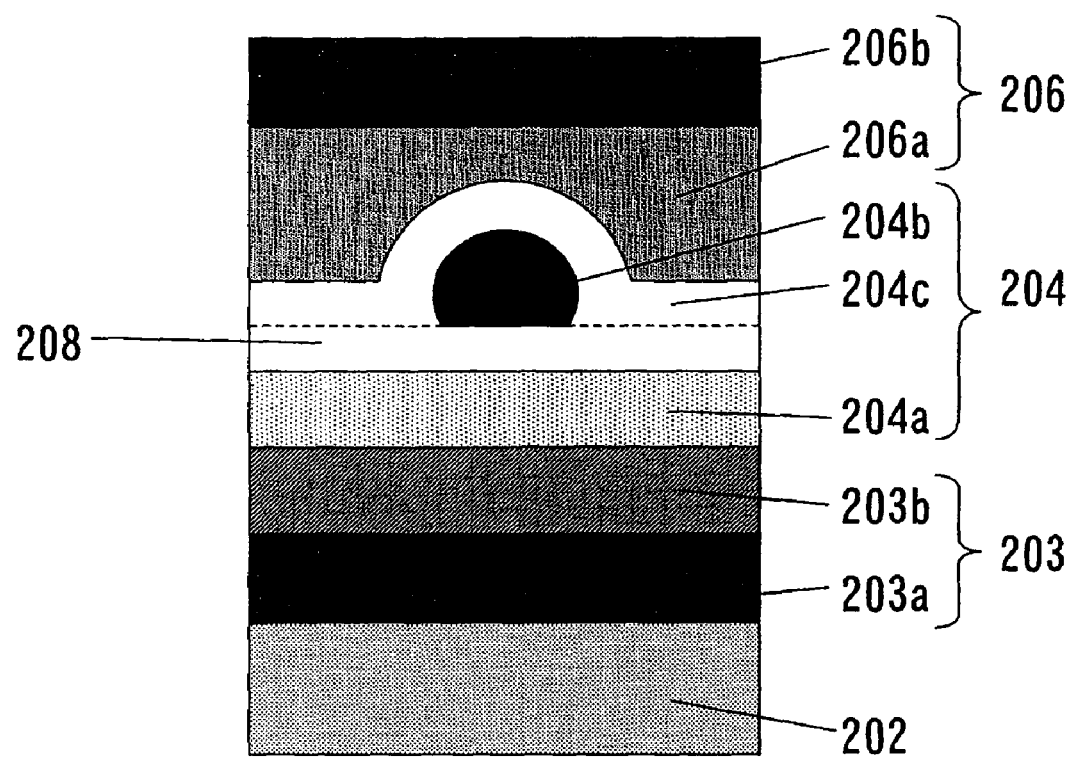
FIG. 12 shows a cross-sectional view illustrating a resistive nonvolatile memory element according to Comparative Example 3.

A structural drawing of the element of Comparative Example 3 is shown in FIG. 12. Production of the element of Comparative Example 3 is similar to the production of the resistive nonvolatile memory element of Example 1 shown in FIG. 7, a step of forming a second tunnel barrier layer on the substrate surface was carried out in Comparative Example 3 between the steps shown in FIG. 7(b) and FIG. 7(c). As a consequence, the resistive nonvolatile memory element 207 of Comparative Example 3 shown in FIG. 12 also had almost the same structure as that of the resistive nonvolatile memory element of Example 1, but was configured such that the metal nanoparticle 204b was not in contact with the oxide semiconductor layer 204a, and that second tunnel barrier layer 208 having a film thickness of 2 nm was provided between them.

Figure 13:
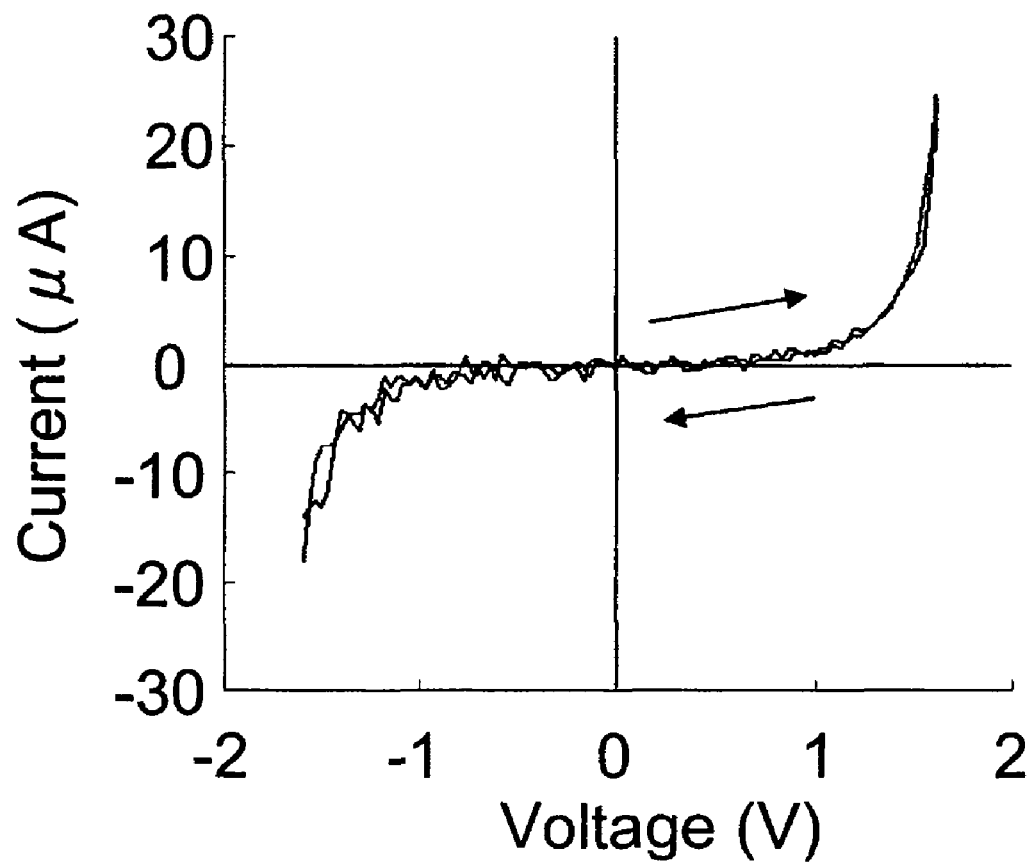
FIG. 13 shows a view illustrating an electric characteristic of a resistive nonvolatile memory element according to Comparative Example 3.

FIG. 13 shows an electric characteristic of the element of Comparative Example 3 observed when a voltage was applied in the range of from −1.6 V to +1.6 V.

As is clearly shown in FIG. 13, the memory characteristic was not achieved with the element of Comparative Example 3 in which the metal nanoparticles 204b were not in contact with the oxide semiconductor layer 204a, which exhibited a high resistance value.

From the results of Comparative Example 3, it is comprehended that the structure in which the metal nanoparticle 204b is in contact with the oxide semiconductor layer 204a is essential according to the present invention.

From the foregoing description, many modifications and other embodiments of the present invention are apparent to persons skilled in the art. Accordingly, the foregoing description should be construed merely as an illustrative example, which was provided for the purpose of teaching best modes for carrying out the present invention to persons skilled in the art. Details of the configuration and/or function of the present invention can be substantially altered without departing from the spirit thereof.

The resistive nonvolatile memory element and the method for production of the same according to the present invention are useful for a memory elements, particularly, useful for micro-fabricated high-capacity nonvolatile memories.

DESCRIPTION OF REFERENCE NUMERALS AND SIGNS

11: semiconductor substrate
12a: electrode film
12b: electrode film
12c: electrode film
13: resistive memory film
14: island growth core
15: seed
16a: surface tension-adjusting film
20: memory element
21: conductive part
22: trap insulating film
23: first tunnel barrier layer
24: electrically conductive fine particle
25: second tunnel barrier layer
26: conductive part
60: substrate
61: bottom electrode
62: information memory layer
63: upper electrode
63b: protruding part of the surface of the upper electrode
64: fine particle
66: protruding part of the surface of the information memory layer
68: inferior face of the information memory layer
69: upper face of the information memory layer
102: first electrode
104: nanochip
106: memory cell material
201: resistive nonvolatile memory element
202: substrate
203: first electrode
203a: first first electrode
203b: second first electrode
204: resistive region
204a: oxide semiconductor layer
204b: metal nanoparticle
204c: tunnel barrier layer
205: ferritin
205a: metal sulfide inside ferritin
205b: external protein of ferritin
206: second electrode
206a: first second electrode
206b: second second electrode
207: element according to Comparative Example 3
208: second tunnel barrier layer
500: material

What is claimed is:

1. A resistive nonvolatile memory element comprising:
a first electrode;
an oxide semiconductor layer which is formed on the first electrode and the resistance of which is altered depending on the applied voltage;
metal nanoparticles having a diameter of between 2 nm and 10 nm and being arranged on the oxide semiconductor layer;
a tunnel barrier layer formed on the oxide semiconductor layer and the metal nanoparticles; and
a second electrode formed on the tunnel barrier layer, said metal nanoparticles being in contact with the oxide semiconductor layer.

2. The resistive nonvolatile memory element according to claim 1 wherein the tunnel barrier layer is constituted with a silicon oxide film, and has a film thickness of between 1 nm and 5 nm.

3. The resistive nonvolatile memory element according to claim 1 wherein the oxide semiconductor layer is constituted with a titanium oxide film.

4. A method for producing a resistive nonvolatile memory element comprising the steps of:
   forming a first electrode on a substrate;
   forming an oxide semiconductor layer the resistance of which is altered depending on the applied voltage, on the first electrode;
   arranging ferritin including a metal compound core on the oxide semiconductor layer;
   modifying the metal compound core into a metal nanoparticle by removing the protein of the ferritin;
   forming a tunnel barrier layer on the oxide semiconductor layer and on the metal nanoparticles; and
   forming a second electrode on the tunnel barrier layer.

5. The method for producing a resistive nonvolatile memory element according to claim 4 wherein the tunnel barrier layer is constituted with a silicon oxide film, and has a film thickness of between 1 nm and 5 nm.

6. The method for producing a resistive nonvolatile memory element according to claim 4 wherein the oxide semiconductor layer is constituted with a titanium oxide film.

7. A method of driving a resistive nonvolatile memory element,
   the resistive nonvolatile memory element comprising:
   a first electrode;
   an oxide semiconductor layer which is formed on the first electrode and the resistance of which is altered depending on the applied voltage;
   metal nanoparticles having a diameter of between 2 nm and 10 nm and being arranged on the oxide semiconductor layer;
   a tunnel barrier layer formed on the oxide semiconductor layer and the metal nanoparticles; and
   a second electrode formed on the tunnel barrier layer,
   said metal nanoparticles being in contact with the oxide semiconductor layer, and
   the driving method comprising:
   a first writing step wherein the resistance state of the oxide semiconductor layer is changed from a low resistance state into a high resistance state by applying a writing voltage so as to make the potential of the first electrode negative with respect to the second electrode;
   a second writing step wherein the resistance state of the oxide semiconductor layer is changed from a high resistance state into a low resistance state by applying a writing voltage so as to make the potential of the first electrode positive with respect to the second electrode; and
   a reading step wherein the resistance state of the oxide semiconductor layer is specified by applying between the first electrode and the second electrode a reading voltage or a reading electric current capable of reading the resistance state without changing the resistance state of the oxide semiconductor layer.

8. The method of driving a resistive nonvolatile memory element according to claim 7 wherein the tunnel barrier layer is constituted with a silicon oxide film, and has a film thickness of between 1 nm and 5 nm.

9. The method of driving a resistive nonvolatile memory element according to claim 7 wherein the oxide semiconductor layer is constituted with a titanium oxide film.

10. The method of driving a resistive nonvolatile memory element according to claim 7 wherein: the absolute value of the writing voltage to give a negative potential of the first electrode with respect to the second electrode; and the absolute value of the writing voltage to give a positive potential of the first electrode with respect to the second electrode are both less than 1.3 V.

* * * * *